United States Patent
Chiu et al.

(10) Patent No.: US 9,917,071 B1
(45) Date of Patent: Mar. 13, 2018

(54) SEMICONDUCTOR PACKAGES (71) Applicant: Advanced Semiconductor Engineering, Inc., Kaohsiung (TW)

(72) Inventors: Ying-Ta Chiu, Kaohsiung (TW);
Yong-Da Chiu, Kaohsiung (TW);
Dao-Long Chen, Kaohsiung (TW);
Chih-Cheng Lee, Kaohsiung (TW);
Chih-Pin Hung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/371,889

(22) Filed: Dec. 7, 2016

(51) Int. Cl.
*H01L 23/48* (2006.01)
*H01L 23/498* (2006.01)
*H01L 23/00* (2006.01)
*H01L 25/065* (2006.01)

(52) U.S. Cl.
CPC .............. *H01L 24/83* (2013.01); *H01L 24/29* (2013.01); *H01L 24/32* (2013.01); *H01L 25/0657* (2013.01); *H01L 2224/29109* (2013.01); *H01L 2224/29111* (2013.01); *H01L 2224/29118* (2013.01); *H01L 2224/29139* (2013.01); *H01L 2224/29144* (2013.01); *H01L 2224/29147* (2013.01); *H01L 2224/32147* (2013.01); *H01L 2224/83139* (2013.01); *H01L 2224/83895* (2013.01); *H01L 2225/06524* (2013.01); *H01L 2924/3511* (2013.01)

(58) Field of Classification Search
CPC ......... H01L 23/32; H01L 24/29; H01L 24/83; H01L 2924/3511; H01L 25/0655; H01L 2224/83191; H01L 2924/00014; H01L 2224/20; H01L 2225/06524; H01L 2224/29111; H01L 23/481; H01L 2224/4824; H01L 2224/29101; H01L 2224/32145; H01L 2224/2919; H01L 25/0657; H01L 2224/29139; H01L 23/538; H01L 2224/02371; H01L 2224/24145; H01L 24/32
See application file for complete search history.

(56) References Cited

U.S. PATENT DOCUMENTS

| | | |
|---|---|---|
| 7,183,648 B2 | 2/2007 | Ramanathan et al. |
| 8,076,177 B2 | 12/2011 | Chen et al. |
| 8,237,273 B2 | 8/2012 | Hsu et al. |

(Continued)

*Primary Examiner* — Jasmine Clark
(74) *Attorney, Agent, or Firm* — Foley & Lardner LLP; Cliff Z. Liu (57) ABSTRACT

A semiconductor package includes: a first substrate including a first interconnection structure extending from a surface of the first substrate, the first interconnection structure including grains of a first size, a second substrate including: a second interconnection structure comprising grains of a second size, and a third interconnection structure disposed between the first interconnection structure and the second interconnection structure, the third interconnection structure including grains of a third size, a first sidewall inclined at a first angle to a reference plane and a second sidewall inclined at a second angle to the reference plane, wherein the first angle is different from the second angle, the first sidewall is disposed between the first substrate and the second sidewall, and the third size is smaller than both the first size and the second size.

20 Claims, 8 Drawing Sheets

(56) References Cited

U.S. PATENT DOCUMENTS 9,673,176 B2 * 6/2017 Cheng .................... H01L 23/481
2015/0061115 A1 * 3/2015 Chen ....................... H01L 24/13
  257/737

* cited by examiner

SEMICONDUCTOR PACKAGES

TECHNICAL FIELD

The present disclosure generally relates to a semiconductor package and more particularly relates to a semiconductor package with reinforced interconnection structures.

BACKGROUND

Since the first integrated circuit appeared, the semiconductor industry has experienced continuous rapid growth due to constant improvements in the integration density of various electronic components and semiconductor packages. For the most part, these improvements in integration density have come from repeated reductions in minimum feature size, allowing more components to be integrated into a semiconductor chip or package. One approach for allowing more components to be integrated into a semiconductor structure is the adoption of three dimensional integrated circuit (3D IC) stacking techniques, in which silicon wafers and/or dies are stacked on one another. A technique for stacking semiconductor wafers and/or substrates in a semiconductor package employs the use of direct bonding between metal interconnection structures (e.g., direct copper to copper (Cu—Cu) bonding) of two substrates. However, to achieve successful bonding, precise alignment between two substrates and high co-planarity of interconnection structures on each substrate are involved to directly bond the interconnection structures of one substrate to the interconnection structures of another substrate. Moreover, warpage of the two substrates during the thermal cycle (due to, e.g., the relatively high temperature for direct bonding) may result in failure of bonding. Additionally, conventional Cu—Cu bonding is performed in an environment with high temperature, high pressure and/or a high degree of vacuum. Therefore, there is a need for, among other things, a semiconductor package that has a high tolerance for misalignment and a lack of co-planarity of interconnection structures during a bonding process.

SUMMARY

In some embodiments, according to one aspect, a semiconductor package includes: a first substrate including a first interconnection structure extended from a surface of the first substrate, the first interconnection structure comprising grains of a first size, a second substrate including: a second interconnection structure including grains of a second size, and a third interconnection structure disposed between the first interconnection structure and the second interconnection structure, the third interconnection structure including grains of a third size, a first sidewall inclined at a first angle to a reference plane and a second sidewall inclined at a second angle to the reference plane, wherein the first angle is different from the second angle, the first sidewall is disposed between the first substrate and the second sidewall, and the third size is smaller than both the first size and the second size.

In some embodiments, according to another aspect, a semiconductor package includes: a first substrate including a first interconnection structure extending from a surface of the first substrate, a second substrate including: a second interconnection structure, and a third interconnection structure disposed between the first interconnection structure and the second interconnection structure, the third interconnection structure including a first sidewall inclined at a first angle to a reference plane and a second sidewall inclined at a second angle to the reference plane, the first sidewall is disposed between the first substrate and the second sidewall, the first angle is different from the second angle, wherein the first interconnection structure and the second interconnection structure define a space.

In some embodiments, according to another aspect, a semiconductor package includes: a first substrate including a first interconnection structure extending from a surface of the first substrate, the first interconnection structure including grains of a first size, a second substrate including: a second interconnection structure including grains of a second size, and a third interconnection structure disposed between the first interconnection structure and the second interconnection structure, the third interconnection structure including grains of a third size, wherein the first interconnection structure and the second interconnection structure define a space, and the third size is smaller than both the first size and the second size.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

DETAILED DESCRIPTION

Manufacturing and use of the embodiments of the present disclosure are discussed in detail below. It should be appreciated, however, that the embodiments set forth many applicable inventive concepts that can be embodied in a wide variety of specific contexts. It is to be understood that the following disclosure provides many different embodiments or examples of implementing different features of various embodiments. Specific examples of components and arrangements are described below for purposes of discussion. These are, of course, merely examples and are not intended to be limiting.

Embodiments, or examples, illustrated in the figures are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of this disclosure.

Further, it is understood that several processing steps (operations) and/or features of a device may be briefly described. Also, additional processing steps and/or features can be added, and certain of the processing steps and/or features described herein can be removed or changed while implementing the methods described herein or while using the systems and devices described herein. Thus, the following description should be understood to represent examples, and are not intended to suggest that one or more steps or features are required for every implementation.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element or feature as illustrated in the Figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may be interpreted accordingly.

Figure 1:
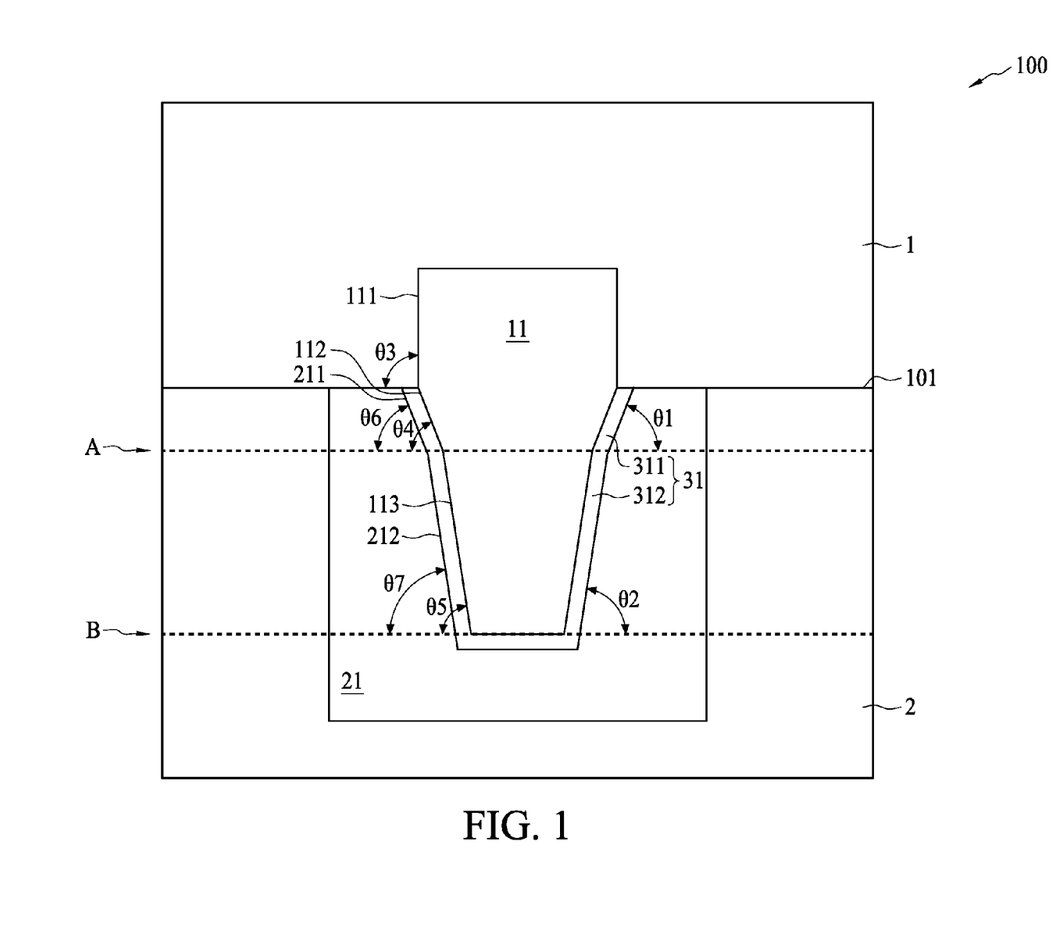
FIG. 1 is a schematic diagram illustrating a semiconductor package in accordance with some embodiments of the present disclosure.

With reference to the Figures, FIG. 1 is a cross-sectional view of a semiconductor package 100 in accordance with some embodiments of the present disclosure. The semiconductor package 100 includes substrates 1 and 2.

The substrate 1 includes an interconnection structure 11. The interconnection structure 11 extends from the substrate 1 into the substrate 2. The interconnection structure 11 includes a base portion (not specifically denoted with a reference number in FIG. 1) disposed within the substrate 1 and a protrusion or extension portion (not specifically denoted with a reference number in FIG. 1) that protrudes from the base portion into the substrate 2. A bottom surface 101 of the substrate 1 is an interface between the substrate 1 and the substrate 2. The surface 101 is substantially coplanar with a top surface of the substrate 2.

The substrate 2 includes an interconnection structure 21. The substrate 2 includes an interconnection structure 31. The interconnection structure 21 is disposed within the substrate 2. The interconnection structure 31 is disposed between the interconnection structure 11 and the interconnection structure 21. The interconnection structure 31 may have a cup-shaped structure (e.g. may have a receptacle-shaped structure defining an opening or a recess). The interconnection structure 31 surrounds a portion of the interconnection structure 11. The interconnection structure 31 surrounds the protrusion portion of the interconnection structure 11 from the substrate 1. The interconnection structure 31 surrounds an extension of the interconnection structure 11 from the substrate 1. The interconnection structure 21 surrounds the interconnection structure 31.

The interconnection structure 31 includes sidewalls 311 and 312. The sidewall 311 is inclined at an angle $\theta_1$ to a reference plane A (shown in dotted line) which is substantially parallel to the surface 101. The sidewall 312 is inclined at an angle $\theta_2$ to another reference plane B (shown in dotted line) which is substantially parallel to the surface 101. The surface 101, the reference plane A and the reference plane B are substantially parallel to one another. The angle $\theta_1$ is different than the angle $\theta_2$. The angle $\theta_1$ and the angle $\theta_2$ may each be, for example, in a range from about 45 degrees to about 90 degrees. The angle $\theta_1$ is smaller than the angle $\theta_2$.

The interconnection structure 11 includes grains/particles (not shown in FIG. 1) having a first size (or first grain/particle diameter) on average. The interconnection structure 21 includes grains/particles (not shown in FIG. 1) having a second size on average. The interconnection structure 31 includes grains/particles (not shown in FIG. 1) having a third size on average. The first size may be the same as the second size. The first size may be different from the second size. The first size may be smaller than the second size. The third size may be smaller than the first size. The third size may be smaller than the second size. A smaller grain size may indicate a greater hardness. Thus, in some embodiments where the first size is smaller than the second size, and the third size is smaller than the first size, a material of the interconnection structure 31 is harder than a material of the interconnection structure 21, and the material of the interconnection structure 31 is harder than a material of the interconnection structure 11.

The interconnection structure 11 includes a sidewall 111 inclined at an angle $\theta_3$ to the surface 101. The interconnection structure 11 includes another sidewall 112 inclined at an angle $\theta_4$ to the first reference plane A. The interconnection structure 11 includes another sidewall 113 inclined at an angle $\theta_5$ to the reference plane B. The angles $\theta_3$, $\theta_4$ and $\theta_5$ are different from one another, and may each be, for example, in a range from about 45 degrees to about 90 degrees. The angle $\theta_4$ is smaller than the angle $\theta_5$. The angle $\theta_4$ is smaller than the angle $\theta_3$. The angle $\theta_5$ is smaller than the angle $\theta_3$.

The interconnection structure 21 includes a sidewall 211 inclined at an angle $\theta_6$ to the reference plane A. The interconnection structure 21 includes another sidewall 212 inclined at an angle $\theta_7$ to the reference plane B. The angle $\theta_6$ and the angle $\theta_7$ are different from each other, and may each be, for example, in a range from about 45 degrees to about 90 degrees. The angle $\theta_6$ is smaller than the angle $\theta_7$.

Each of the substrate 1 and the substrate 2 may include a single-layer substrate, a multi-layered substrate, a gradient substrate, or any combinations thereof and/or the like, such that the semiconductor package 100 can have one or more active and passive components and circuits thereon/therein. Each of the substrate 1 and the substrate 2 may include, for example, bulk silicon, a semiconductor wafer, a silicon-on-insulator (SOI) substrate, or a silicon germanium substrate. Other semiconductor materials including group III, group IV, and group V elements may also be used for the substrate 1 and the substrate 2. Each of the substrate 1 and the substrate 2 may include a Printed Circuit Board (PCB). Materials for the substrate 1 and the substrate 2 can include any of (but are not limited to) epoxy resin, polymercaptan curing agent, or other amine curing agents.

The material for the interconnection structures 11, 21 and 31 includes, for example, copper, tin, gold, silver, zinc, indium or an alloy thereof.

Figure 2:
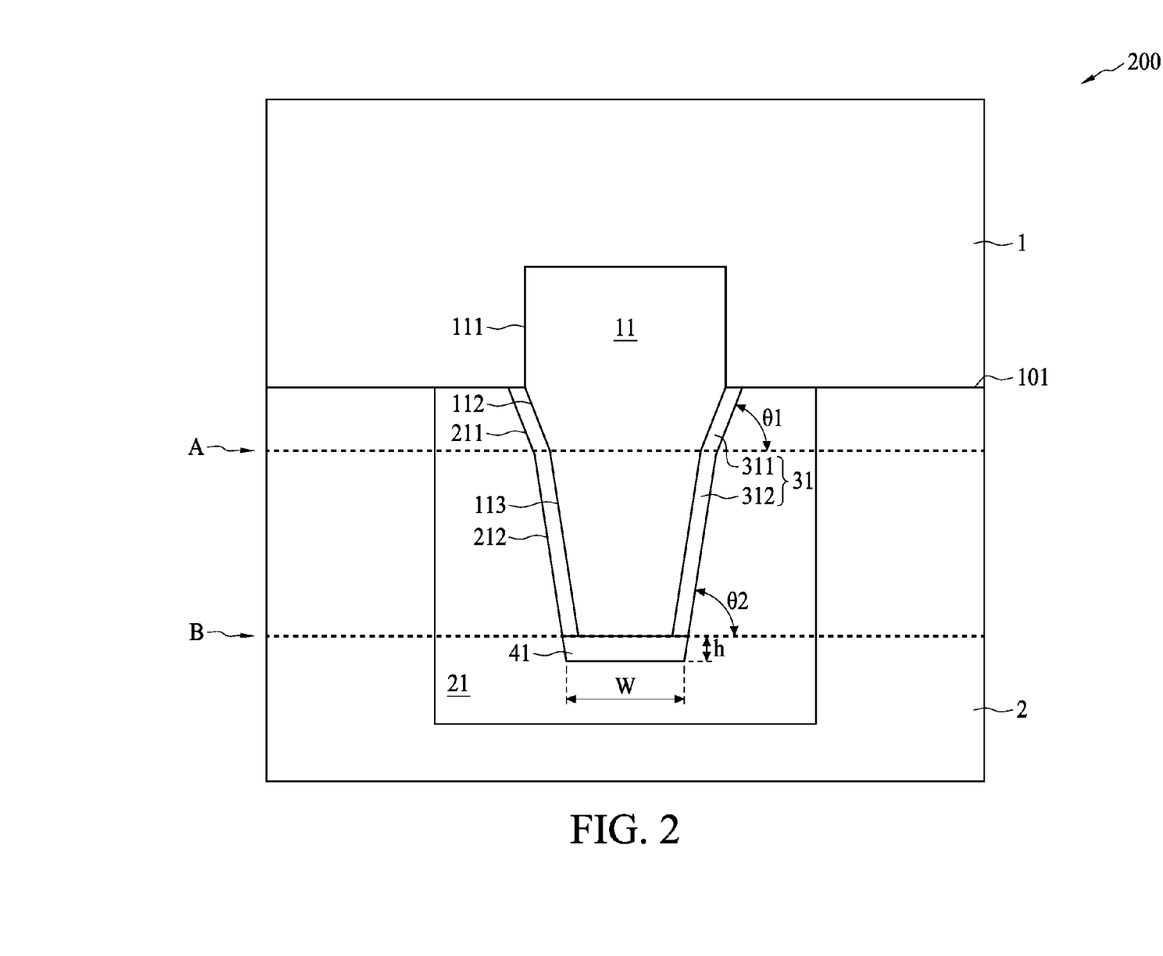
FIG. 2 is a schematic diagram illustrating a semiconductor package in accordance with some embodiments of the present disclosure.

FIG. 2 is a cross-sectional view of a semiconductor package 200 in accordance with some embodiments of the present disclosure. The semiconductor package 200 is similar to the semiconductor package 100 as described and illustrated with reference to FIG. 1, except that a space 41 is defined by interconnection structures 11, 21 and 31.

The space 41 may lie between the interconnection structure 11 and the interconnection structure 21. The space 41 may lie between the interconnection structure 21 and the interconnection structure 31. The space 41 may have an approximate disk shape. The space 41 may have a non-zero height h smaller than about 1 micrometer (μm). The space 41 may have a non-zero width W smaller than about 1 μm.

Figure 3:
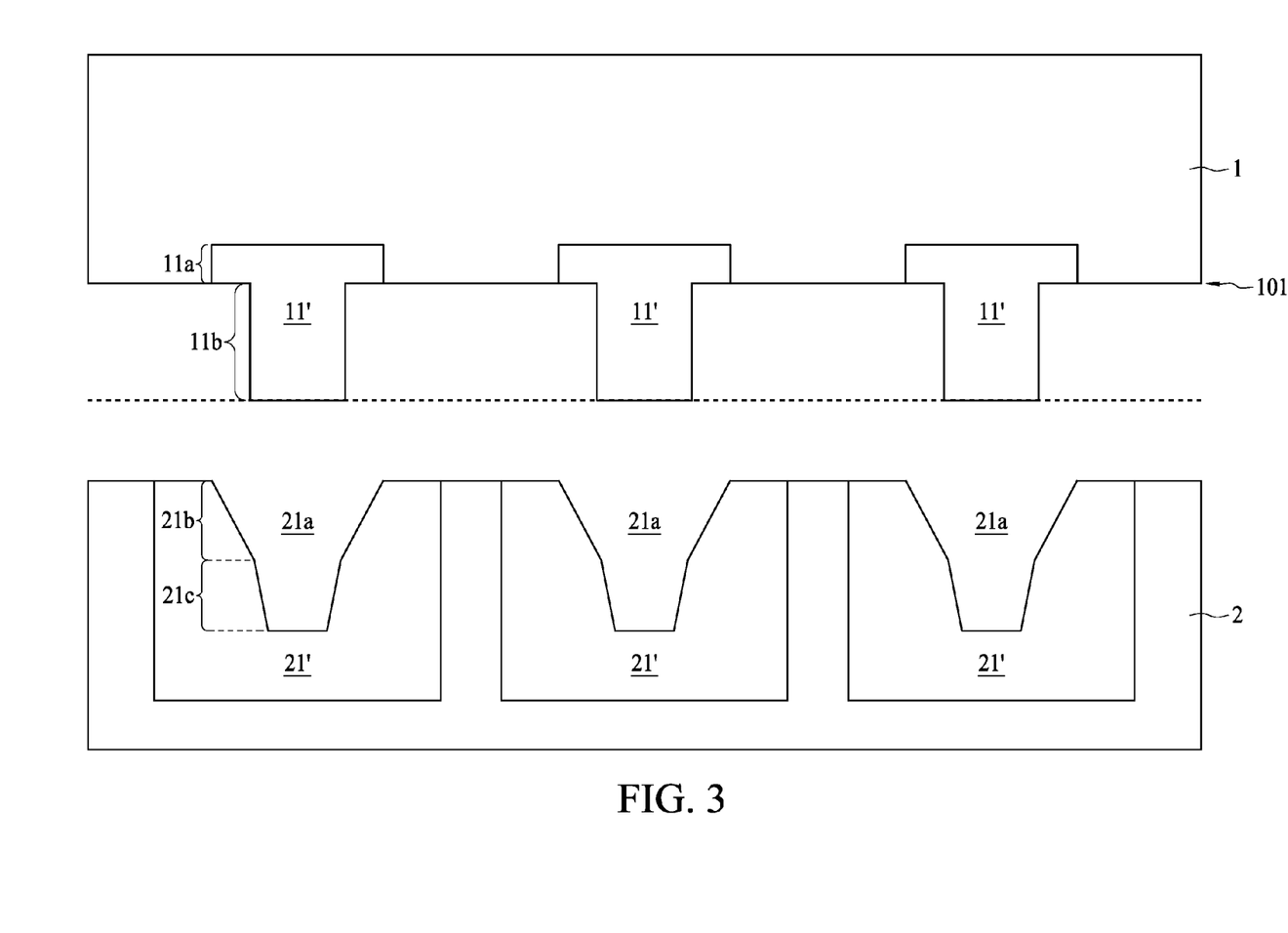
FIG. 3 is a schematic diagram illustrating an assembly of two substrates to form a semiconductor package in accordance with some embodiments of the present disclosure.

FIG. 3 is a cross-sectional view of the substrate 1 and the substrate 2 prior to their assembly in accordance with some embodiments of the present disclosure. The substrate 1 includes a plurality of interconnection structures 11'. Each of the interconnection structures 11' includes a pad portion 11a and a protruding portion 11b. The pad portion 11a is disposed within the substrate 1. The protruding portion 11b extends from the surface 101 of the substrate 1.

As shown in FIG. 3, the substrate 2 includes a plurality of interconnection structures 21'. Each of the interconnection structures 21' defines a respective opening 21a. The opening 21a includes an upper portion 21b and a lower portion 21c. The opening 21a is downwardly tapered—that is, the opening 21a becomes narrower as the bottom of the opening 21a is approached. The upper portion 21b has a width greater than or the same as a width of the lower portion 21c. The upper portion 21b is downwardly tapered. The lower portion 21c is downwardly tapered. The width of the protruding portion 11b is substantially the same as or greater than that of the lower portion 21c of the opening 21a. The width of the protruding portion 11b is smaller than that of a widest portion of the upper portion 21b of the opening 21a.

During assembly, the substrate 1 is bonded to the substrate 2 such that each protruding portion 11b of the interconnection structures 11' is inserted into a corresponding opening 21a. The protruding portion 11b can be received by the upper portion 21b of the opening 21a and guided into the lower portion 21c of the opening 21a. The protruding portion 11b need not be aligned directly with the lower portion 21c of the opening 21a, as the upper portion 21b of the opening 21a will guide a slightly misaligned protruding portion 11' towards the lower portion 21c. Therefore, the assembly process may have a high tolerance for misalignment and lack of co-planarity of the interconnection structures 11' and 21', which may help to avoid damage from warpage. Subsequent to pressing the interconnection structure 11' in to the interconnection structure 21' (and/or vice versa), the interconnection structure 31 may be formed between the interconnection structure 11' and the interconnection structure 21' to form the semiconductor package 100 as shown in FIG. 1.

Figure 4:
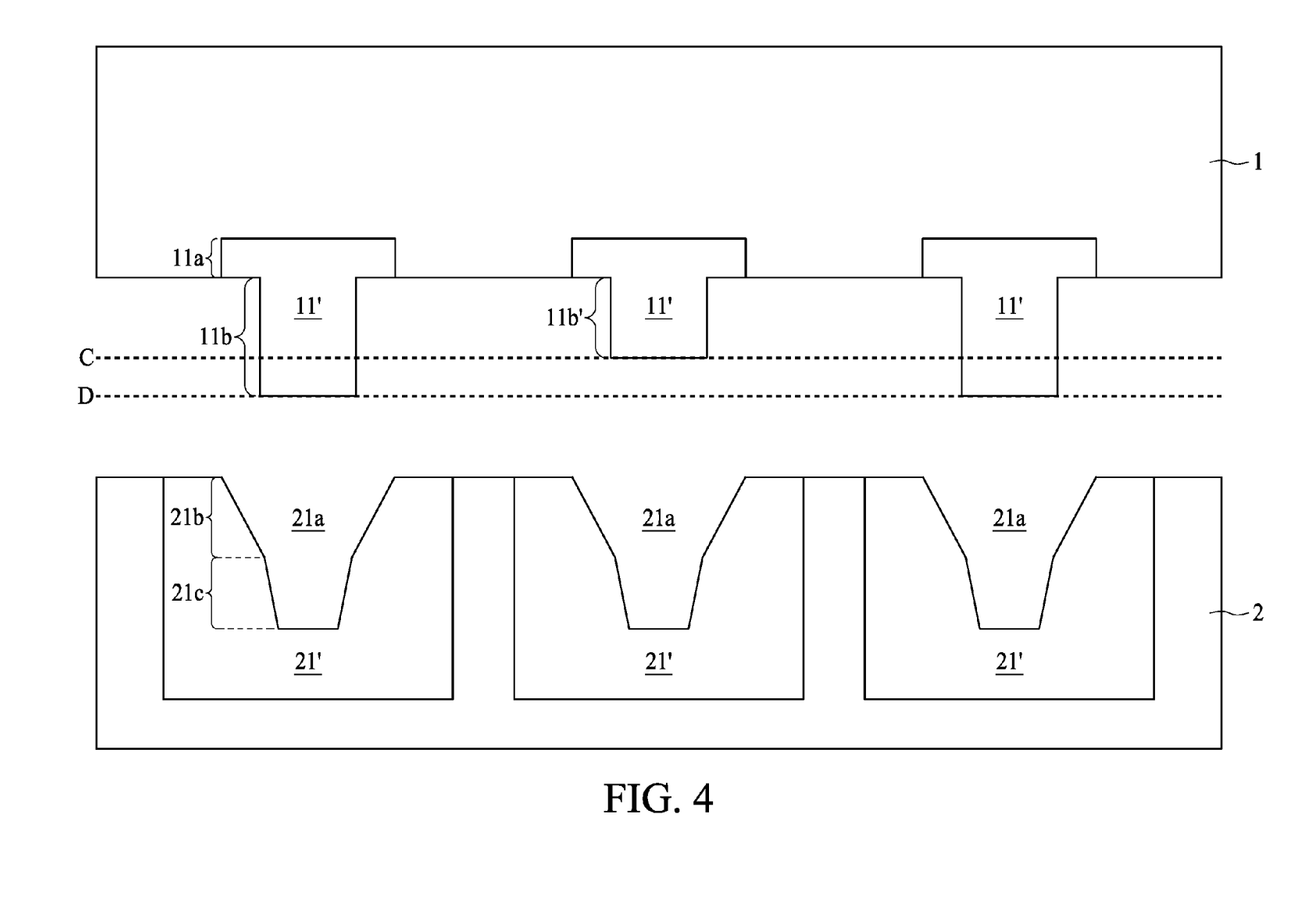
FIG. 4 is a schematic diagram illustrating an assembly of two substrates to form a semiconductor package in accordance with some embodiments of the present disclosure.

FIG. 4 is a cross-sectional view of the substrate 1 and the substrate 2 prior to their assembly in accordance with some embodiments of the present disclosure. The substrate 2 as shown in FIG. 4 is similar or the same as the substrate 2 as described and illustrated with reference to FIG. 3. The substrate 1 as shown in FIG. 4 is similar to the substrate 1 as described and illustrated with reference to FIG. 3, except that one of the interconnection structures 11' of the substrate 1 includes a relatively shorter protruding portion 11b'. The shorter protruding portion 11b' is not coplanar with other protruding portions 11b. A bottom of each of the protruding portions 11b aligns with a reference plane D. The bottom of the protruding portion 11b' aligns with a reference plane C, which is closer to the substrate 1 than is reference plane D.

During assembly, the substrate 1 is pressed to the substrate 2 (and/or vice versa) such that each of the protruding portions 11b and the protruding portion 11b' is inserted into a corresponding opening 21a. Each of the protruding portions 11b and the protruding portion 11b' can be directed or guided by the upper portion 21b of the opening 21a into the lower portion 21c of the opening 21a. Subsequent to pressing the interconnection structure 11' to the interconnection structure 21' (and/or vice versa), the interconnection structure 31 may be formed between the interconnection structure 11' and the interconnection structure 21' to form the semiconductor package 100 as shown in FIG. 1 or the semiconductor package 200 (which defines the space 41 due to the relatively shorter structure of the protruding portion 11b') as shown in FIG. 2. Although it is not illustrated in FIG. 3 or FIG. 4, it is contemplated that the interconnection structures 11' of the substrate 1 may include a relatively longer protruding portion, and the interconnection structure 31 may be formed between the interconnection structure 11' and the interconnection structure 21' to form the semiconductor package 100 as shown in FIG. 1.

Figure 5:
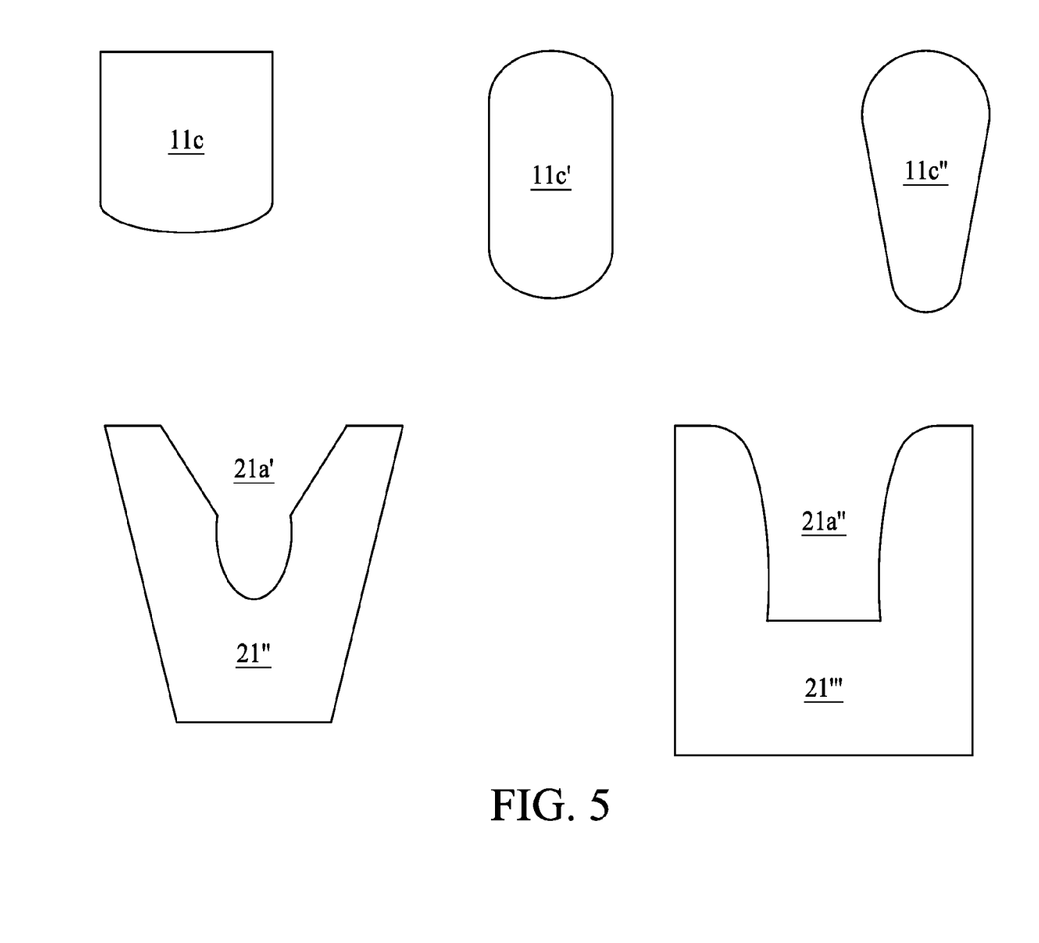
FIG. 5 is a schematic diagram illustrating various interconnection structures in accordance with some embodiments of the present disclosure.

FIG. 5 is a schematic diagram illustrating the interconnection structure 11 and the interconnection structure 21 in accordance with some embodiments of the present disclosure. As shown in FIG. 5, the interconnection structures 11c, 11c' and 11c" have different geometric shapes. The interconnection structure 11c is a pillar structure with a rounded end, the interconnection structure 11c' is a pillar structure with two rounded ends and the interconnection structure 11c" is a tapered pillar structure with two rounded ends (in other embodiments, a single end or no ends may be rounded). The interconnection structures 21" and 21'" are shaped to have openings with different geometries. For example, the interconnection structure 21" has an opening 21a' that is a combination of a triangle and an ellipse in cross-sectional view—that is, in a cross sectional view a top part of the opening 21a' is downwardly tapered, and a bottom part of the opening 21a' is in the shape of a semi-ellipse. The interconnection structure 21'" has an opening 21a" that has curved sidewalls.

Figure 6:
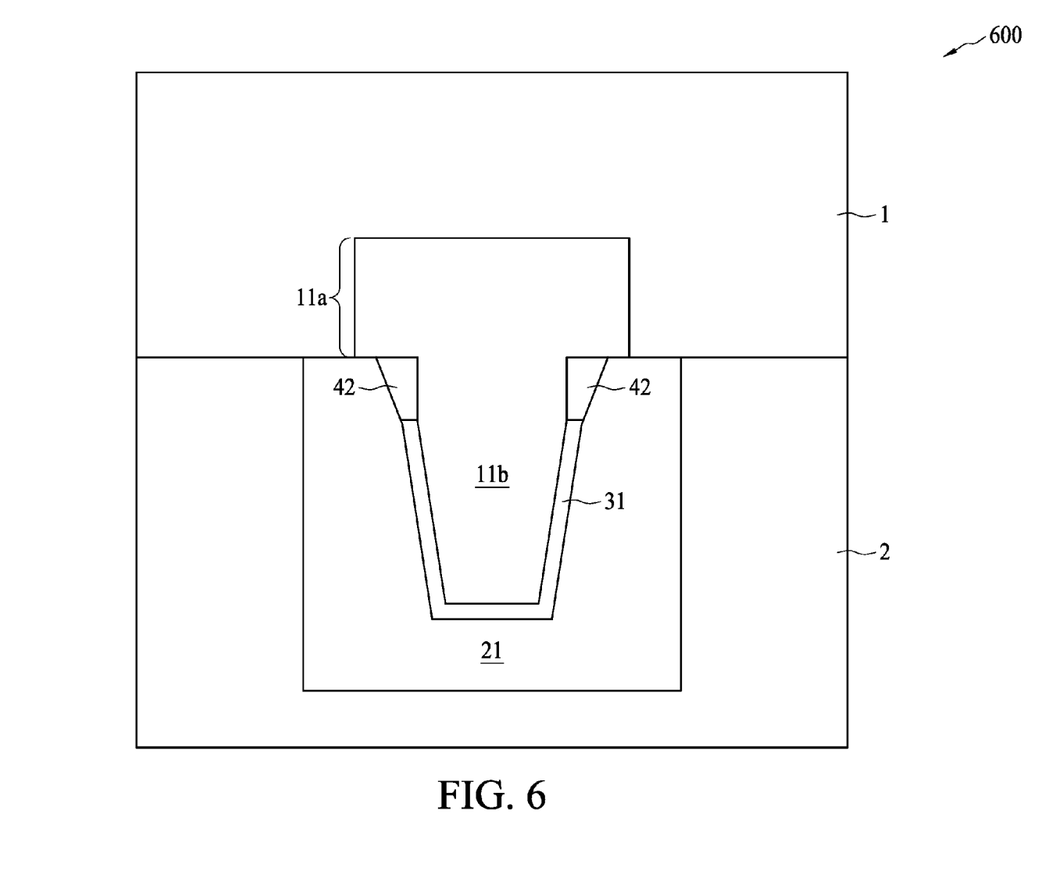
FIG. 6 is a schematic diagram illustrating a semiconductor package in accordance with some embodiments of the present disclosure.

FIG. 6 is a cross-sectional view of a semiconductor package 600 in accordance with some embodiments of the present disclosure. The semiconductor package 600 of FIG. 6 is similar to the semiconductor package 100 of FIG. 1, except that the semiconductor package 600 further includes spaces 42 defined by a pad portion 11a and a protruding portion 11b of the interconnection structure 11, the interconnection structure 21 and the interconnection structure 31.

Figure 7:
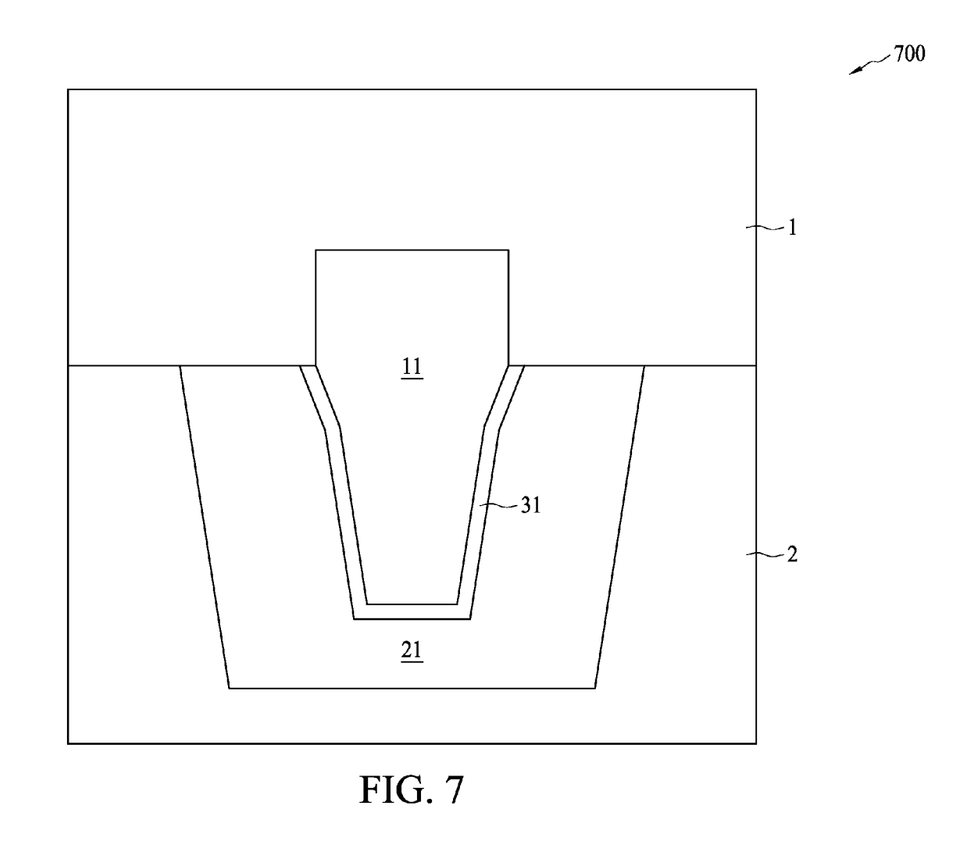
FIG. 7 is a schematic diagram illustrating a semiconductor package in accordance with some embodiments of the present disclosure.

FIG. 7 is a cross-sectional view of a semiconductor package 700 in accordance with some embodiments of the present disclosure. The semiconductor package 700 of FIG. 7 is similar to the semiconductor package 100 of FIG. 1, except that the interconnection structure 21 of the semiconductor package 700 is tapered down opposite to the substrate 1.

Figure 8:
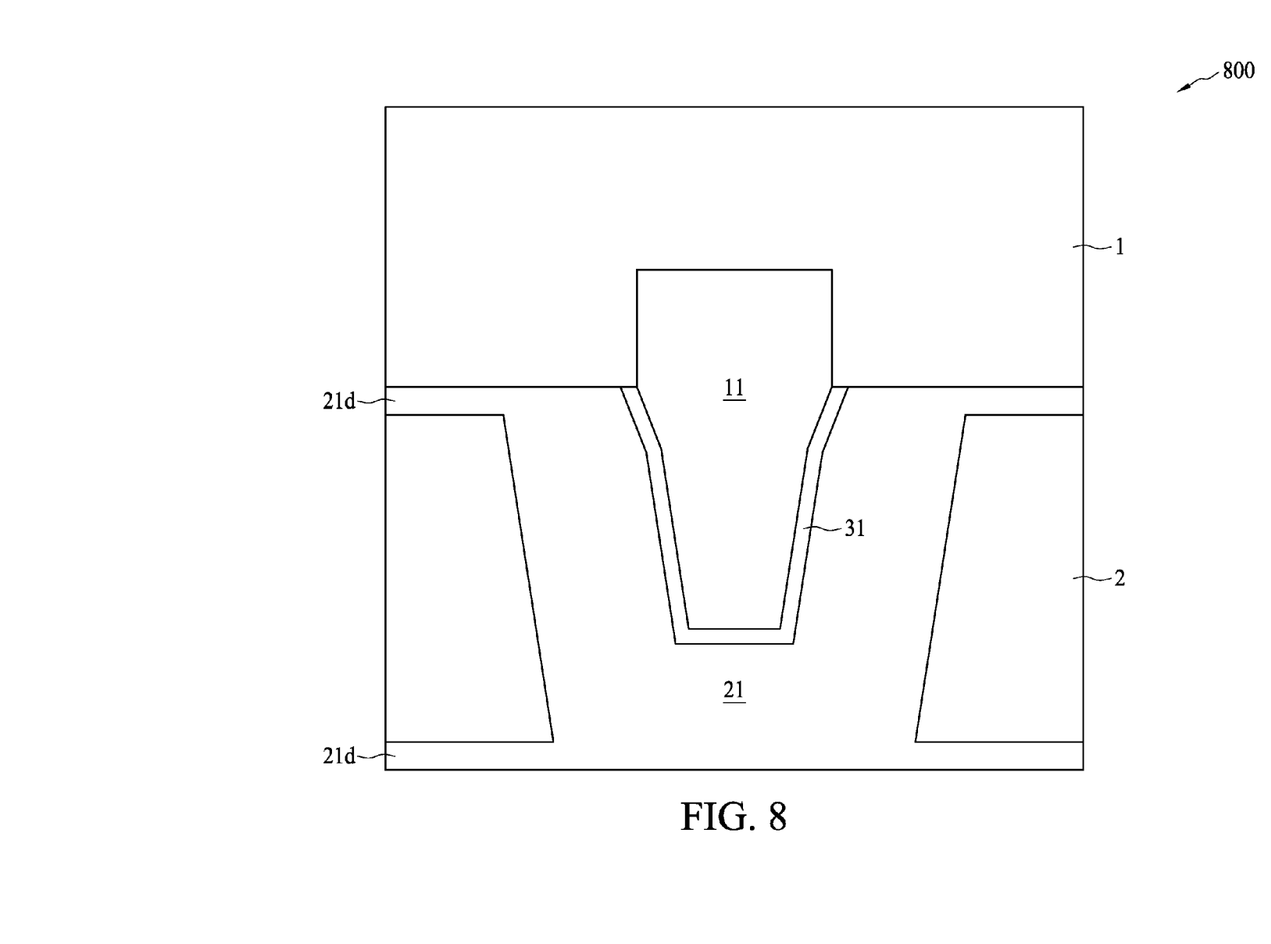
FIG. 8 is a schematic diagram illustrating a semiconductor package in accordance with some embodiments of the present disclosure.

FIG. 8 is a cross-sectional view of a semiconductor package 800 in accordance with some embodiments of the present disclosure. The semiconductor package 800 of FIG. 8 and the semiconductor package 700 of FIG. 7 are similar, except that the interconnection structure 21 of the semiconductor package 800 extends completely through the substrate 2. Additionally, the interconnection structure 21 includes layers 21d, one of which is disposed between the substrate 1 and the substrate 2, and the other which is disposed under a bottom-most surface of the substrate 2.

As used herein, the singular terms "a," "an," and "the" may include plural referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

In the description of some embodiments, a component provided "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
   a first substrate comprising a first interconnection structure extending from a surface of the first substrate, the first interconnection structure comprising grains of a first size;
   a second substrate comprising:
      a second interconnection structure comprising grains of a second size; and
      a third interconnection structure disposed between the first interconnection structure and the second interconnection structure, the third interconnection structure comprising:
         grains of a third size;
         a first sidewall inclined at a first angle to a reference plane; and
         a second sidewall inclined at a second angle to the reference plane;
      wherein the first angle is different from the second angle, the first sidewall is disposed between the first substrate and the second sidewall, and the third size is smaller than both the first size and the second size.

2. The semiconductor package according to claim 1, wherein the first size is substantially the same as the second size.

3. The semiconductor package according to claim 1, wherein the first size is different from the second size.

4. The semiconductor package according to claim 1, wherein the first angle is smaller than the second angle.

5. The semiconductor package according to claim 1, wherein the first interconnection structure further comprises a first sidewall inclined at a third angle to the reference plane, a second sidewall inclined at a fourth angle to the reference plane and a third sidewall inclined at a fifth angle to the reference plane, the third, fourth and fifth angles being different from each other, the second sidewall of the first interconnection structure being disposed between the first sidewall of the first interconnection structure and the third sidewall of the first interconnection structure.

6. The semiconductor package according to claim 5, wherein the fourth angle is smaller than the fifth angle.

7. The semiconductor package according to claim 1, wherein the second interconnection structure comprises a first sidewall inclined at a sixth angle to the reference plane and a second sidewall inclined at a seventh angle to the reference plane, the sixth and seventh angles being different from each other.

8. The semiconductor package according to claim 7, wherein the sixth angle is smaller than the seventh angle.

9. The semiconductor package according to claim 1, wherein the second interconnection structure surrounds the third interconnection structure.

10. The semiconductor package according to claim 1, wherein the second interconnection structure is disposed within the second substrate.

11. A semiconductor package, comprising:
    a first substrate comprising a first interconnection structure extending from a surface of the first substrate;
    a second substrate comprising:
       a second interconnection structure; and
       a third interconnection structure disposed between the first interconnection structure and the second interconnection structure, the third interconnection structure comprising a first sidewall inclined at a first angle to a reference plane and a second sidewall inclined at a second angle to the reference plane, the first sidewall is disposed between the first substrate and the second sidewall, the first angle is different from the second angle;
    wherein the first interconnection structure and the second interconnection structure define a space.

12. The semiconductor package according to claim 11, wherein the first angle is smaller than the second angle.

13. The semiconductor package according to claim 11, wherein the space lies between the second interconnection structure and third interconnection structure.

14. The semiconductor package according to claim 11, wherein the space is defined by the first interconnection structure, the second interconnection structure and the third interconnection structure.

15. The semiconductor package according to claim 11, wherein the space has a height smaller than 1 μm.

16. The semiconductor package according to claim 11, wherein the space has a width smaller than 1 μm.

17. A semiconductor package, comprising:
- a first substrate comprising a first interconnection structure extending from a surface of the first substrate, the first interconnection structure comprising grains of a first size;
- a second substrate comprising:
  - a second interconnection structure comprising grains of a second size; and
  - a third interconnection structure disposed between the first interconnection structure and the second interconnection structure, the third interconnection structure comprising grains of a third size,
- wherein the first interconnection structure and the second interconnection structure define a space, and the third size is smaller than both the first size and the second size.

18. The semiconductor package according to claim 17, wherein the space lies between the second interconnection structure and third interconnection structure.

19. The semiconductor package according to claim 17 wherein the space has a height smaller than 1 μm.

20. The semiconductor package according to claim 17, wherein the space has a width smaller than 1 μm.

* * * * *